TIMING CIRCUIT WITH FIELD EFFECT TRANSISTOR

Filed Jan. 25, 1967

Inventor
RONALD J. ZEGARSKI
JOHN S. DAME
BY
Mueller, Aichele & Rauner
ATTYS.

United States Patent Office 3,496,389
Patented Feb. 17, 1970

3,496,389
TIMING CIRCUIT WITH FIELD EFFECT TRANSISTOR

Ronald J. Zegarski, Hickory Hills, and John S. Dame, Elmhurst, Ill., assignors to Motorola, Inc., Franklin Park, Ill., a corporation of Illinois Filed Jan. 25, 1967, Ser. No. 611,677
Int. Cl. H03k *17/26*
U.S. Cl. 307—293 5 Claims

ABSTRACT OF THE DISCLOSURE

This invention relates to timing circuits and in particular to a simple timing circuit including a resistor-capacitor timing portion and a field effect transistor. The field effect transistor rectifies half cycles of one polarity of an alternating signal and the capacitor is charged by the half cycles of opposite polarity to build up a charge on the capacitor so that it applies a bias to cut off the transistor. The capacitor discharges through the resistance which has high impedance to provide a relatively long timed interval.

BACKGROUND OF THE INVENTION

Application Ser. No. 611,676, filed on the same day as the instant application discloses and claim a threshold circuit which is suitable for use with the timing circuit described and claimed in this application.

Electronic timing circuits have been provided wherein a capacitor is charged, and then discharged through a circuit of controlled impedance to provide a predetermined time interval. In order to provide a long time interval, it is necessary that the capacitor be very large or that the resistance through which the capacitor is discharged be extremely high. Because of this, it has been impractical to provide capacitor discharge timing circuits for intervals which may extend to an hour or more.

Another problem with electronic timing circuits is that the characteristics thereof change with the components used and with temperature, so that the timed periods are not accurately repeated. To provide temperature compensation, complex circuit configurations have been used which result in many parts to thereby increase the cost.

SUMMARY OF THE INVENTION

It is an object of the present invention to provide a simple timing circuit which accurately provides long timed periods.

Another object of this invention is to provide a timing circuit which can be set by alternating current input signals.

A further object of the invention is to provide a timing circuit having a capacitor which is rapidly charged to set the timer, and which discharges through a very high impedance to provide a long timed period.

A still further object is to provide a timing circuit which compensates for variations in the components used therein.

A feature of the invention is the provision of a timing circuit including a resistor-capacitor timing portion and a field effect transistor, wherein the high impedance of the junction of the field effect transistor makes it possible to accurately control the discharge path of the capacitor.

Another feature of the invention is the provision of a field effect transistor timing circuit for actuation by an alternating current input signal wherein a diode of the field effect transistor cooperates with a separate diode to form a charging circuit for the capacitor, which when charged applies a reverse bias to the same field effect transistor and thereby controls the condition through the channel thereof.

A further feature of the invention is the provision of a timing circuit including a capacitor and a field effect transistor, and having a feedback path from the capacitor to an input circuit to reduce the gain thereof when the capacitor is charged.

The timing circuit of the invention includes a high impedance resistor and a timing capacitor, and is set by an alternating current input signal applied to the gate of a field effect transistor through an input capacitor. The input signal is rectified by the gate to source diode of the field effect transistor to charge the input capacitor during excursions of one polarity, and during excursions of the opposite polarity the potentials applied to the gate cut off current flow through the channel of the field effect transistor. The latter potentials are also applied through a diode to the timing capacitor, which is connected to the drain of the field effect transistor, to charge the timing capacitor. The drain is connected to the supply potential through a resistor which applies the supply potential to the capacitor when the transistor is cut off. Accordingly, the capacitor has opposite polarity potentials applied to the two terminals thereof to charge the same to a potential of the order of twice the supply potential. When the input signal terminates, the capacitor discharges through the high impedance resistor to provide an accurate timed interval.

To compensate for varying characteristics of the field effect transistor used, a feedback path may be provided from the charging capacitor to an input circuit to cut off the input signal when the capacitor is charged to the desired voltage level.

The term "alternating current" as used in this application applies to signals having a periodic wave form with components extending in opposite polarity directions, as, for example, from near ground potential in a positive direction and then in a negative direction toward ground.

The invention is illustrated in the drawings wherein:

FIG. 2 is a chart illustrating the operation of the circuit of FIG. 1; and

FIG. 3 illustrates a second embodiment of the invention including a feedback path to compensate for differing characteristics of the field effect transistor.

DETAILED DESCRIPTION

Figure 1:
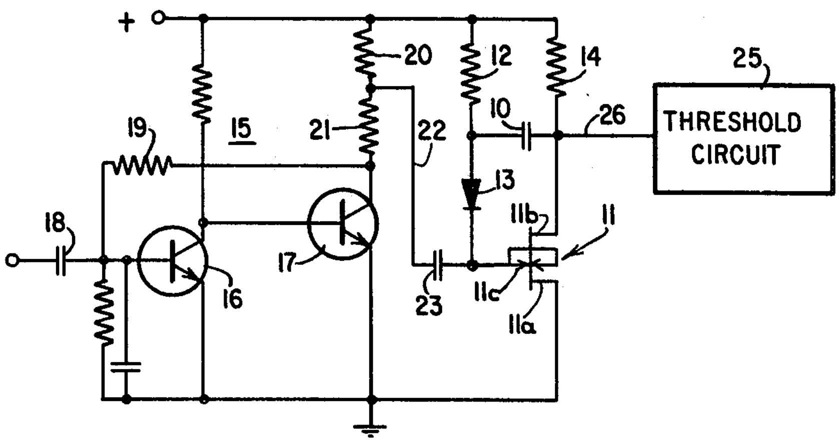
FIG. 1 is a circuit diagram of a timing circuit in accordance with the invention.
Figure 1:
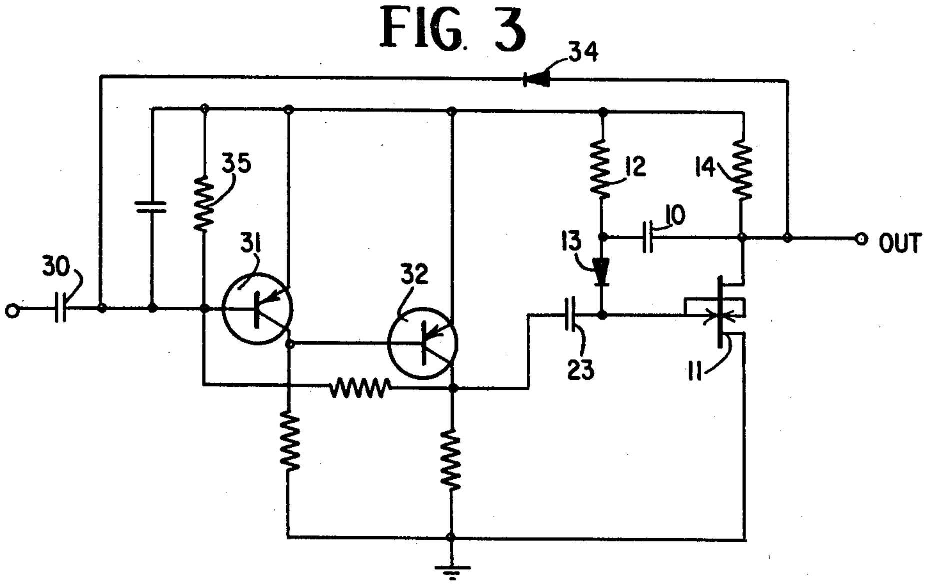
Figure 1:
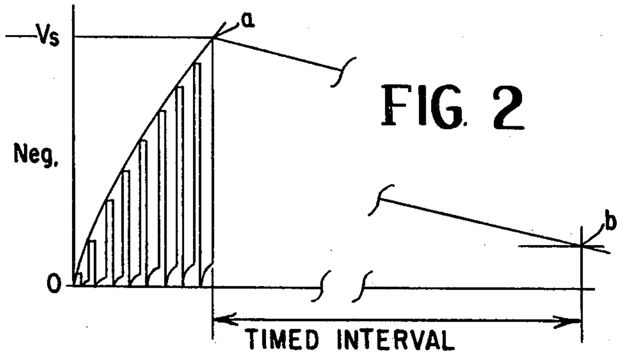

In FIG. 1 the timing circuit is shown including timing capacitor 10, high impedance resistor 12 and field effect transistor 11. The field effect transistor has a channel terminated by source and drain electrodes **11*a* and 11*b* respectively, and a gate electrode 11*c*** which controls the conductivity through the channel. A pair of gates may be provided on opposite sides of the channel and connected in common as shown.

Input signals to be applied to the timing circuit are coupled through capacitor 18 to the input threshold circuit 15 which includes transistors 16 and 17 connected as a Schmitt trigger circuit. Transistor 16 is rendered conducting when a signal of a predetermined level is applied thereto. This acts to cut off transistor 17 to reduce current flow through resistors 20 and 21 connecting the collector thereof to the positive supply potential. Positive feedback through resistor 19 provides fast trigger action. The output from the threshold circuit is derived from conductor 22 connected to the junction of resistors 20 and 21. Conductor 22 is at the supply potential when transistor 17 does not conduct, and is at a value between the supply potential and ground when transistor 17 conducts, with the signal value depending upon the relative values of resistors 20 and 21. Normally resistor 21 will have a relatively low value so that the potential on line 22 approaches ground.

When a positive potential is applied to line 22, input capacitor 23 is charged through the circuit including the gate to source rectifier of the field effect transistor 11. That is, the gate to source rectifier connects capacitor 23 to ground so that this capacitor is charged to the positive potential. When the potential on line 22 swings in the negative direction toward ground, the charged capacitor 23 will apply a negative potential to the gate of field effect transistor 11. This will cut off the field effect transistor so that the channel will have a high impedance. The negative potential applied by capacitor 23 will render diode 13 conducting to apply a negative potential to the left hand plate of capacitor 10. As field effect transistor 11 is cut off, resistor 14 will apply a positive potential from the supply to the right hand plate of capacitor 10. Capacitor 10 will, therefore, have opposite polarity potentials on the two plates so that this capacitor will charge. Resistor 12 has a very high impedance such as 100 megohms and will not have a substantial effect on the charging action described.

Capacitor 10 is much larger than capacitor 23 and will not fully charge on each cycle of the input signal. For example, capacitor 10 may have a value of the order of 1 microfarad and capacitor 23 a value of .05 microfarad. Capacitor 23 may be substantially fully charged on each cycle so that the negative potential applied by diode 13 to the left plate of capacitor 10 has a value which may be substantially the same as the supply voltage. This voltage can be controlled by the relative values of resistors 20 and 21, so that the charge of capacitor 10 is adjusted to compensate for variations in the characteristics of the field effect transistor.

FIG. 2 shows the voltage applied to the gate electrode 11*c* of the field effect transistor 11. This is the voltage at the junction between capacitor 10 and resistor 12, when the diode 13 is conducting. Diode 13 has a high leakage relative to that of the field effect transistor 11 so that the potential at the junction of capacitor 10 and resistor 12 is seen at the gate 11*c* of the field effect transistor. Each time the potential applied through capacitor 23 goes positive (near ground), the diode 13 will be cut off and the potential applied to the gate electrode 11*c* will render field effect transistor 11 conducting. It will be apparent that the voltage applied to the gate electrode 11*c* builds up in steps from repeating cycles of the applied signal until it reaches a negative value approaching the value of the supply voltage $V_s$, as shown by point *a* in FIG. 2.

When the input signal terminates, the charge on capacitor 10 which is applied through diode 13 to the gate electrode 11*c* will hold the transistor cut off to start the timed period. Capacitor 10 then discharges through resistor 12 so that the negative voltage applied to the gate electrode 11*c* gradually goes positive. As the gate voltage of the field effect transistor goes positive, the transistor starts to conduct and the drain voltage which is at the positive supply voltage when the transistor is cut off, goes negative. This voltage is applied to the threshold circuit 25 and when it reaches a predetermined value the threshold circuit will respond to terminate the timed period. The point at which the threshold circuit responds is indicated as *b* on FIG. 2 and the time between points *a* and *b* is therefore the timed period. The threshold circuit 25 may be of the type described in application Ser. No. 611,676, referred to above.

As resistor 12 can have a very high impedance, the timed period can be quite long, even when using a capacitor 10 and supply voltage of practical values. In the event that the input burst continues after the capacitor is fully charged, the capacitor will be held charged until the input burst terminates, and then the timed period will start. The voltage applied by capacitor 10 to the gate electrode may be greater (negative) than required to cut off the field effect transistor, and in this case capacitor 10 will discharge for a short time before the field effect transistor starts to conduct. This can be controlled by selecting the ratio of resistors 20 and 21. This time will normally be very short as compared to the timed period so that it does not substantially affect the same. The operation will be the same in response to each input signal burst so that the timing is highly accurate.

The threshold circuit 25 determines the timed period which is initiated when the supply potential is applied thereto through resistor 14 and line 26 when transistor 11 is cut off. When capacitor 10 discharges transistor 11 will again conduct and the potential applied from the drain electrode to the threshold circuit 25 will drop to the threshold value to terminate the timed period. This may take place when the voltage applied to gate electrode 11*c* is near ground to provide the maximum timed period. As the transistor 11 conducts on each cycle, even after capacitor 10 is charged, the voltage on line 26 will be returned to ground on each cycle. By providing an element in the threshold circuit having a reaction time greater than the period of the applied wave, such as a relay, it can be held on continuously when it is operated until the set-up time period ends.

The system can be used to set a timed interval in response to a burst of a plurality of cycles of the input signal. For the timed period to be the same on each actuation, the capacitor 10 must be charged to full voltage by the applied signal each time the circuit is set. On the other hand, the charging should be completed at the end of the burst of input signal, as the duration of continued charging will add to the timed period. The charging period is generally quite small as compared to the timed period, so that the time of continued charging will not materially affect the timed period. It may be desired to provide different timed periods by applying input bursts of different lengths. An applied signal having only a few cycles will partially charge the capacitor to provide a short timed period, and an input signal having more cycles will provide full charge to cause the full timed period.

In FIG. 3 there is shown a circuit similar to that of FIG. 1, with corresponding elements having the same numbers. The threshold circuit which supplies the input signals to the timing circuit is shown with PNP transistors, rather than NPN transistors as in FIG. 1. Input signals applied through coupling capacitor 30 control the conductivity of transistor 31, and the switching voltage at the collector thereof is applied to the base of transistor 32 to selectively render this transistor conducting.

The timing capacitor 10 is connected through diode 34 to the base of transistor 31. When the capacitor 10 is charged, diode 34 connects resistor 14 (in the drain circuit of the field effect transistor) effectively in parallel with resistor 35 between the emitter and base of transistor 31. This reduces the effective input impedance at transistor 31 and reduces the signal at this point. Therefore, when capacitor 10 is charged to the desired value, the feedback action reduces the level of the signal at transistor 31 so that it is inadequate to actuate the Schmitt trigger formed by transistors 31 and 32. Accordingly, the application of input signals from transistor 32 to the input capacitor 23 is terminated.

The feedback action acts to prevent further charging of the timing capacitor 10 when the desired voltge has been built up thereacross. This insures that the voltage will be the same for each timed period to render the system more accurate and to automatically compensate for variations in the characteristics of the components used in the system.

The timing circuit of the invention has been found to be very satisfactory in actual use. The circuit has very few components and can therefore be provided at low cost. This circuit can be used for very long time periods, up to 12 hours or more, which previously required counter chains or mechanical clocks.

We claim:

1. A timing circuit including in combination, a field effect transistor having source, drain and gate electrodes, means connected to said source and drain electrodes for applying a direct current potential thereacross to cause current flow between said drain and source electrodes, a timing circuit including resistor means and capacitor means having first and second terminals, with said first terminal connected to one of said source and drain electrodes, and input circuit means connected to said gate electrode and including diode means connected between said gate electrode and said second terminal of said capacitor means, said diode means being poled to conduct signals of a polarity opposite to the signals conducted by said source and gate electrodes of said transistor, said input circuit means applying a potential through said diode means to said capacitor means for charging the same and applying a potential to said gate electrode to cut off current flow between said drain and source electrodes, said resistor means being connected between said second terminal of said capacitor means and a reference potential and providing a high impedance discharge path for said capacitor means.

2. A timing circuit in accordance with claim 1 further including means forming a feedback path connecting said first terminal of said capacitor means to said input circuit means for attenuating the signal applied to said input circuit means in response to cut off of said field effect transistor.

3. A circuit responsive to an input signal having first components extending in one polarity direction and second components extending in the opposite polarity direction, such circuit including in combination; a field effect transistor having a channel terminated by source and drain electrodes and a gate electrode controlling current flow through said channel, first resistor means connected in series with said channel of said transistor, means applying a potential across said first resistor means and said channel to cause conduction therethrough, input capacitor means connected to said gate electrode for applying the input signal thereto, said gate electrode and said channel forming a rectifier which conducts in response to the first components of the input signal to charge said input capacitor means, said input capacitor means applying a voltage to said gate electrode of a polarity to cut off current flow through said channel of said field effect transistor in response to the second components of the input signal, a timing circuit including timing capacitor means and second resistor means connected in series with each other across said first resistor means, said second resistor means having an impedance substantially greater than that of said first resistor means, and diode means connected in series with said timing capacitor means between said gate electrode and the common connection between said first resistor means and said channel of said field effect transistor, said diode means being poled to conduct in response to the second components of the input signal to charge said timing capacitor means and apply a voltage to said gate electrode of said field effect transistor to cut off the same, said timing capacitor means discharging through said second resistor means in the absence of an input signal to render said field effect transistor conductive.

4. The circuit of claim 3 wherein said first resistor means is connected to said drain electrode and applies a direct current potential thereto, and said timing capacitor means is connected to said drain electrode and is charged by the potential supplied through said first resistor means to said drain electrode and by a potential of opposite polarity applied through said diode, with an increasing charge being built up across said timing capacitor means by successive signal components.

5. The circuit of claim 3 including threshold means connected to said common connection between said first resistor means and said channel of said field effect transistor, said first resistor means applying a voltage to said threshold means in response to cut of said field effect transistor to initiate a timed period and applying a decreasing voltage thereto as said field effect transistor conducts, said threshold circuit respondng to a predetermined voltage to terminate the timed period.

References Cited

UNITED STATES PATENTS

| | | | |
|---|---|---|---|
| 2,594,104 | 4/1952 | Washburn | 307—228 X |
| 2,999,174 | 9/1961 | Randise | 307—228 |
| 3,392,352 | 7/1968 | White | 307—293 X |

OTHER REFERENCES

"Field Effect Transistors, Theory and Application Notes," No. 1, June 1962, Amelco Semiconductors, pages 5 to 7.

DONALD D. FORRER, Primary Examiner

S. D. MILLER, Assistant Examiner

U.S. Cl. X.R.

307—290, 304